United States Patent
Martin

(10) Patent No.: US 8,405,430 B2
(45) Date of Patent: Mar. 26, 2013

(54) CIRCUIT CONFIGURATION FOR PROTECTING A CIRCUIT ELEMENT HAVING OVERCURRENT AND OVERTEMPERATURE DETECTION

(75) Inventor: Edmund Martin, Schwalbach (DE)

(73) Assignee: Continental Automotive GmbH, Hannover (DE)

( * ) Notice: Subject to any disclaimer, the term of this patent is extended or adjusted under 35 U.S.C. 154(b) by 101 days.

(21) Appl. No.: 12/738,022

(22) PCT Filed: Oct. 16, 2008

(86) PCT No.: PCT/EP2008/063932
§ 371 (c)(1),
(2), (4) Date: Apr. 14, 2010

(87) PCT Pub. No.: WO2009/050224
PCT Pub. Date: Apr. 23, 2009

(65) Prior Publication Data
US 2010/0237927 A1 Sep. 23, 2010

(30) Foreign Application Priority Data
Oct. 17, 2007 (DE) .......................... 10 2007 049 789

(51) Int. Cl.
*H03K 3/00* (2006.01)

(52) U.S. Cl. ........................................ 327/108; 361/90

(58) Field of Classification Search .................. 327/108; 361/90
See application file for complete search history.

(56) References Cited

U.S. PATENT DOCUMENTS

| | | | |
|---|---|---|---|
| 4,600,963 A | 7/1986 | Hertrich et al. | |
| 4,703,390 A | 10/1987 | Fay et al. | |
| 4,787,007 A * | 11/1988 | Matsumura et al. | 361/98 |
| 4,937,697 A | 6/1990 | Edwards et al. | |
| 5,808,504 A * | 9/1998 | Chikai et al. | 327/434 |
| 6,351,107 B1 * | 2/2002 | Okita | 323/282 |
| 7,009,857 B2 * | 3/2006 | Chen et al. | 363/60 |
| 7,031,129 B2 * | 4/2006 | Mayama et al. | 361/91.1 |
| 7,054,171 B1 * | 5/2006 | Bailly et al. | 363/21.08 |
| 7,119,606 B2 * | 10/2006 | Fahim | 327/541 |
| 7,274,174 B2 * | 9/2007 | Wang et al. | 323/224 |
| 7,301,318 B2 * | 11/2007 | Haider et al. | 323/282 |
| 7,388,422 B2 * | 6/2008 | Khan et al. | 327/536 |
| 7,538,535 B2 * | 5/2009 | McDonald et al. | 323/288 |
| 7,554,305 B2 * | 6/2009 | Nunokawa et al. | 323/273 |
| 7,622,820 B1 * | 11/2009 | Prodic et al. | 307/31 |

FOREIGN PATENT DOCUMENTS

| | | |
|---|---|---|
| DE | 33 02 864 C1 | 11/1983 |
| DE | 34 20 236 A1 | 12/1985 |
| DE | 43 16 185 A1 | 11/1994 |
| FR | 2 843 245 A1 | 2/2004 |

* cited by examiner

*Primary Examiner* — Kenneth B. Wells
(74) *Attorney, Agent, or Firm* — Cozen O'Connor

(57) ABSTRACT

A circuit configuration having a detection unit designed to generate an output signal that is representative of a load current of a transistor switch, depending on an input signal that is representative of the load current of the transistor switch. The detection unit includes a temperature compensation unit that is designed to take into account the temperature of the transistor switch. The detection unit further includes a delay unit that is designed to delay the detection of the input signal until a prescribed switch-on time period, relative to a switch-on procedure of the transistor switch, has passed. The detection unit is designed in an application-specific integrated circuit.

17 Claims, 1 Drawing Sheet

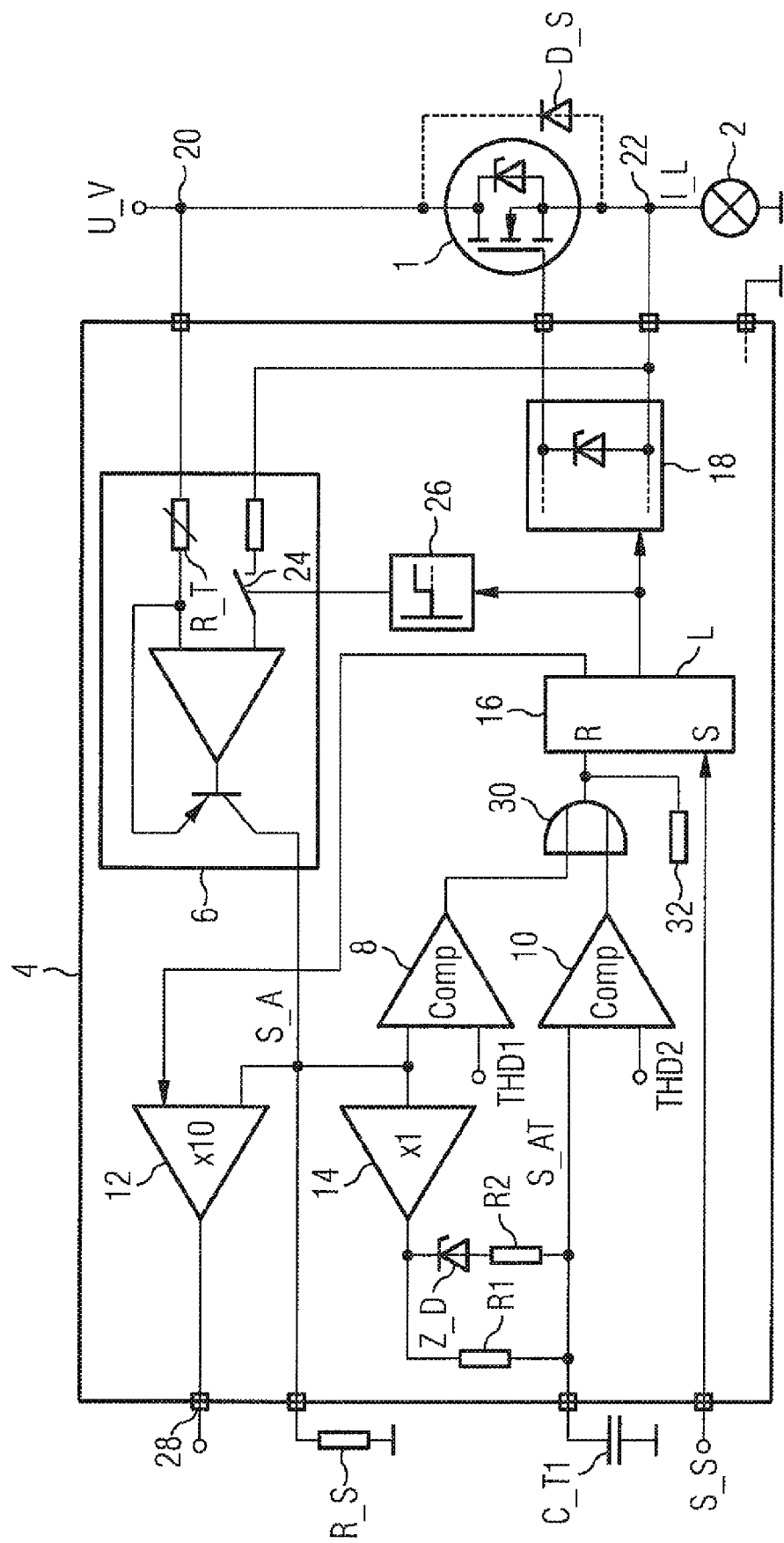

CIRCUIT CONFIGURATION FOR PROTECTING A CIRCUIT ELEMENT HAVING OVERCURRENT AND OVERTEMPERATURE DETECTION

BACKGROUND OF THE INVENTION

Field of the Invention

The invention relates to a circuit arrangement that can be used in connection with a transistor switch for controlling a load device. Such load devices can be lamps in particular lamps used in motor vehicles.

SUMMARY OF THE INVENTION

In this connection it is a challenge to ensure completely satisfactory operation of the transistor switch over a long operating time period and thus to keep down the need for repairs.

An object of the invention is to provide a circuit arrangement that enables reliable operation of a transistor switch.

In accordance with one embodiment of the invention a circuit arrangement comprises a detection unit designed for generating an output signal representative of a load current of a transistor switch, to be precise depending on an input signal representative of a load current of a transistor switch. The detection unit comprises a temperature compensation unit designed to take account of the temperature of the transistor switch. It furthermore comprises a delay unit designed to delay the detection of the input signal until a predetermined switch-on time period relative to a switch-on process of the transistor switch has elapsed. The detection unit is embodied in an application-specific integrated circuit. Very fast and precise detection of the load current is possible in this way, which in turn enables early reaction to thermal loading of the transistor switch, in which case a simple evaluation of the load current can be effected without having to take account of the load current characteristic during the switch-on process. Furthermore, as a result of the provision of the application-specific integrated circuit, it is possible to use a multiplicity of different transistor switches which are available in a wide range and also cost-effectively.

In one embodiment the input signal is fed from the transistor switch such that additional components, such as e.g. a measuring resistor, can be dispensed with.

In accordance with one embodiment the circuit arrangement has a first comparator designed for comparing the output signal of the detection unit with a predetermined first threshold value and for initiating a switch-off process of the transistor switch depending on the outcome of the comparison. The first comparator is embodied in the application-specific integrated circuit. This enables particularly fast identification of a load current corresponding to the first threshold value and thus a very nearly instantaneous reaction of the initiation of the switch-off process of the transistor switch.

In accordance with one embodiment a second comparator designed for comparing an output signal of the detection unit, said output signal being filtered by a low-pass filter, with a predetermined second threshold value and for initiating a switch-off process of the transistor switch depending on the outcome of the comparison is embodied in the circuit arrangement, to be precise together with the low-pass filter in the application-specific integrated circuit. Thus, in particular by suitable parameterization of the low-pass filter and suitable predetermination of the second threshold value, it is possible to identify particularly rapidly a load current which, in terms of its profile, is higher in a predetermined manner than that which should be expected given the presence of a predetermined load device, to be precise for example nearly instantaneously with respect to the switch-on process of the transistor switch and in this case, in particular, a current profile which arises as a result of the characteristic of PTC thermistors, with an accompanying high current loading nearly instantaneously with respect to the switch-on process, which subsides with increasing heating of the lamp.

A very nearly instantaneous reaction to such a load current which, in terms of its profile, is higher in a predetermined manner than that which should be expected given the presence of the predetermined load device is thus possible.

In this connection it is advantageous if the low-pass filter comprises a time constant unit, which influences a time constant and which is designed to alter the time constant depending on the output signal of the detection unit. In this way, peak loads for the transistor switch can be identified particularly nearly instantaneously and a correspondingly nearly instantaneous reaction thereto can be effected.

It is particularly advantageous if the time constant unit comprises a parallel circuit formed by, firstly, a first electrical resistor and, secondly, a second electrical resistor and a zener diode. The time constant unit can be realized particularly simply in this way.

In accordance with a further advantageous configuration, a temperature detection unit designed for detecting an ambient temperature and for initiating the switch-off process of the transistor switch depending on a predetermined third threshold value being exceeded by the detected ambient temperature is embodied in the application-specific integrated circuit. In this way it is possible, with particularly high reliability, to avoid operation of the transistor switch at ambient temperatures which are critical for the service life of the transistor switch in the switched-on state, to be precise in particular given suitable predetermination of the third threshold value.

BRIEF DESCRIPTION OF DRAWINGS

Exemplary embodiments of the invention are explained in greater detail below with reference to the schematic drawings.

The single FIGURE is a schematic diagram including a transistor switch 1 and a load device 2.

DETAILED DESCRIPTION OF THE DRAWINGS

The transistor switch 1 is arranged in series with a load device 2 such that, depending on the switching state of the transistor switch 1, a supply voltage potential U_V present at a load input is substantially also present or correspondingly not present at a load output of the transistor switch 1. The supply potential voltage U_V can be, for example, 28 V or 12 V or else any other potential desired. The transistor switch 1 is embodied as a field effect transistor, preferably as a power field effect transistor. Via the load output of the transistor switch 1, the latter is electrically conductively coupled to the load device 2. Consequently, a load current I_L through the load device 2 is predetermined depending on the switching state of the transistor switch 1. The load device 2 can be a lamp, for example. The lamp can be any desired type of lamp known to the person skilled in the art, and so it can be a halogen lamp, a conventional incandescent lamp, or else light emitting diodes. Particularly in the case of incandescent lamps or halogen lamps, incandescent filaments are used which form electrical PTC thermistors. This has the consequence that after a switch-on process of the transistor switch 1, initially a very high load current I_L flows through the load device 2, said current then decreasing with increasing heating of the incandescent filament. An application-specific integrated circuit 4, which can also be designated as ASIC, is assigned to the transistor switch 1 to control and/or monitor the transistor switch 1. The application-specific integrated circuit 4 comprises a detection unit 6, a first comparator 8, a second comparator 10, a first amplifier 12, a second amplifier 14, a low-pass filter, a latch 16 and a charge pump 18. However, the application-specific integrated circuit 4 can also comprise any desired subset of the units mentioned.

The detection unit 6 is coupled on the input side via tapping points 20, 22 for tapping off a voltage drop between the load input and the load output of the transistor switch 1. This is preferably the drain-source voltage in the case of a field effect transistor. The voltage tapped off at the tapping points 20, 22 is representative of the load current I_L of the transistor switch for the turned-on state of the transistor switch 1, disregarding temperature effects of the forward resistance of said transistor switch 1. For the compensation of precisely these temperature influences, the detection unit 6 comprises a temperature compensation unit, which preferably has a temperature-dependent resistor R_T which is designed and dimensioned in such a way that it largely compensates for corresponding temperature effects of the forward resistance in the load branch of the transistor switch 1.

Furthermore, the detection unit 6 also has a delay unit designed to delay the detection of the input signal until a predetermined switch-on period relative to a switch-on process of the transistor switch 1 has elapsed. For this purpose, the delay unit preferably has a delay element 26, which delays a signal responsible for the control of a switch-on process by the predetermined delay time period, converts it into a control signal for activating a delay switch 24 and thus correspondingly delays detection of the input signal of the detection unit 6 relative to the respective switch-on process of the transistor switch 1. In this way, it can be ensured in a simple manner that high voltage drops that occur, if appropriate, during the switch-on process within the load branch of the transistor switch 1 are not converted by the detection unit 6 into a corresponding output signal S_A which, in this case, would then not be representative of the load current I_L in the transistor switch 1 since the transition switch 1 would also not be turned on or not be completely turned on within this time interval.

The temperature compensation unit can be arranged simply and cost-effectively in the application-specific integrated circuit 4. It has been found that sufficiently good temperature compensation can be achieved if the application-specific integrated circuit 4 is positioned adjacent to the transistor switch 1. It has been found that a high load current I_L nearly instantaneously with respect to the switch-on process of the transistor switch 1 brought about by the low resistance of the PTC thermistor of the load device 2, generates very small and therefore negligible temperature faults. By contrast, overload or short-circuit processes increase the temperature of the transistor switch 1 relatively rapidly. In such a case a rapid turn-off of the transistor switch 1 is desirable and exact detection of the load current I_L is not absolutely necessary. Rather, as a result of a temperature compensation that is reduced in this fault case, by the detection unit 6, a purportedly higher load current I_L than is actually present is sensed, which then ultimately accelerates a turn-off of the transistor switch 1, as will be explained in greater detail below.

As a result of the provision of the resistor R_T, the gain of the detection unit 6 can be designed in a temperature-dependent fashion and a temperature response of the forward resistance of the transistor switch 1 can be compensated for.

The detection unit 6 preferably also comprises a level converter, which can in turn comprise a differential amplifier. On the output side of the detection unit, the differential amplifier provides an output signal S_A of the detection unit 6, said output signal being representative of the load current I_L of the transistor switch 1.

A resistor R_S, coupled to the detection unit 6 on the output side, adapts the gain of the detection unit 6 and a suitable signal value range of the output signal S_A of the detection unit 6 can be set. An adaptation to the transistor switch 1 can thus also be performed using resistor R_S.

Preferably, the resistor R_S is arranged externally with respect to the application-specific integrated circuit 4 and can, therefore, be dimensioned differently depending on the transistor switch 1 used, with an otherwise unchanged application-specific integrated circuit 4.

The first amplifier 12 is provided for amplifying the output signal S_A of the detection unit. On the output side first amplifier 12 is coupled to a signal output 28 of the application-specific integrated circuit 4. The signal output 28 can form an interface to a superordinate control device or evaluation device.

The output signal S_A of the detection unit 6 is furthermore provided to the first comparator 8 on its input side, and a predetermined first threshold value THD1, which can be 4 V, for example, is present at a further input of said first comparator 8. The first comparator 8 is designed for comparing the output signal S_A of the detection unit 6 with the predetermined first threshold value THD1 and for initiating a switch-off process of the transistor switch 1, depending on the outcome of the comparison. For this purpose when the output signal S_A exceeds the first threshold value THD1, said comparator 8 provides a high level on its output side. On the output side, the comparator 8 is electrically conductively coupled to a reset input R of the latch 16 via an OR element 30. In the case of a positive logic, therefore, the latch 16 is inhibited by the reset input R in an edge-triggered fashion until the next change in a control signal S_S acting on the set input of said latch and a switch-off process of the switching transistor 1 is thus initiated.

The latch 16 is preferably coupled to the switching transistor 1 via a charge pump 18 for controlling a control input of said switching transistor 1 and can thus initiate a switch-on process and also a switch-off process at the first transistor switch 1 by correspondingly providing corresponding levels at the output of said latch 16. In the case of a transistor switch 1 embodied as a MOSFET, the control input is preferably the gate thereof.

The output signal SA of the detection unit 6 is furthermore fed to the second amplifier 14, which is coupled to a low-pass filter on its output side. The low-pass filter comprises a time constant unit, which preferably comprises a first electrical resistor R_1 in a first branch and comprises, in a second branch formed electrically in parallel, a second electrical resistor R_2 and, in series with resistor R_2, a zener diode Z_D. Furthermore, the low-pass filter is assigned a capacitance C_T1, which can be realized by a capacitor by external interconnection of the application-specific integrated circuit 4. As a result of external provision of the capacitance C_T1, the circuit arrangement can be adapted to respectively different characteristics of the transistor switch 1 and/or of the load device 2 in a simple manner.

As a result of the parallel connection of, firstly, the first electrical resistor R1 and, secondly, the second electrical resistor R2 and the zener diode Z_D, the time constant of the low-pass filter can be set depending on the output signal S_A of the detection unit 6, to be precise depending on the values of the output signal S_A and thus for example depending on the amplitude thereof. In this respect, a significantly lower time constant can be set in the case of a high signal amplitude. The zener diode Z_D is designed for example in such a way that it limits the voltage drop occurring at it to a maximum of 2 V. The first resistor R1 can have a resistance of 200 kΩ, for example, and the second resistor R_2 can have a resistance of 30 kΩ, for example.

A filtered output signal S_AT of the detection unit is provided on output side of the low-pass filter and made available to the second comparator 10 and its input side. At a further input of the second comparator 10, a predetermined second threshold value THD2 is applied thereto, which second threshold value can be 500 mV. The second comparator 10 is designed for comparing the output signal S_AT of the detection unit 6, which output signal has been filtered by the low-pass filter, with the predefined second threshold value THD2 and for initiating a switch-off process of the transistor switch 1 depending on the outcome of the comparison. On the output side, the second comparator 10 is coupled to the reset input R of the latch 16 via the OR element 30. As a result of the suitable dimensioning of the low-pass filter in interaction with the suitable dimensioning of the second threshold value THD2, it is possible to identify, particularly rapidly, a load current I_L which, in terms of its profile, is higher in a predetermined manner than that which should be expected given the presence of an expected characteristic of the load device 2.

Furthermore, a temperature detection unit 32 can also be embodied in the application-specific integrated circuit 4, said temperature detection unit being designed for detecting the ambient temperature of the application-specific integrated circuit 4. Temperature detection unit 32 is furthermore designed to initiate the switch-off process of the transistor switch 1 in the case of a third threshold value being exceeded by the detected ambient temperature. For this purpose, the temperature detection unit 32 is preferably likewise coupled to the reset input of the latch 16.

When the reset input R of the latch 16 is activated, corresponding signaling is preferably carried out at the signal output 28, which can be realized for example by a signal value that is increased in comparison with the maximum signal value that can be achieved by the output signal S_A of the detection unit 6. In this way, it is also possible to signal to the assigned control or evaluation unit when the latch 16 is in its reset state.

As a result of the provision of the low-pass filter in interaction with the second comparator 10, realized on the application-specific integrated circuit 4, it is possible to protect fusible links that are present as well, in the short-circuit case, before the response, said fusible links being situated, in particular, in a lead which feeds the supply voltage potential U_V.

By virtue of the configuration of the application-specific integrated circuit 4, it is possible to avoid severe heating of the transistor switch 1, even in the fault case, to the effect that the transistor switch 1 is not heated up to a critical temperature range, and it can therefore be ensured in a simple manner that, despite the possible occurrence of many short circuits, the transistor switch 1 has a long service life.

The substrate diode of the transistor switch 1, in particular in the case where the latter is embodied as a field effect transistor, can be used for the commutation of the load current I_L in the context of a switch-off process of the transistor switch 1. Longer lines, such as are customary in the case of trucks constitute an inductance that may have to be taken into account, if appropriate. If the loading capacity of the transistor switch 1 is insufficient, it is additionally possible, if appropriate, to connect an additional diode D_S in parallel with the load input and load output of the transistor switch 1, that is to say in particular in parallel with the drain-source path. The diode D_S can also be designated as a suppressor diode.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A circuit arrangement comprising:
   a transistor switch; and
   a detection unit coupled to the transistor switch configured to generate an output signal representative of a load current of the transistor switch based at least in part on an input signal representative of the load current of the transistor switch comprising:
      a temperature compensation unit configured to compensate for a temperature of the transistor switch; and
      a delay unit configured to delay a detection of the input signal until a predetermined switch-on time period relative to a switch-on process of the transistor switch has elapsed;
   a low-pass filter configured to filter the output of the detection unit; and
   a first comparator configured to:
      compare the filtered output of the detection unit with a predetermined threshold value; and
      initiate a switch-off process of the transistor switch based at least in part on the outcome of the comparison,
   wherein the detection unit is embodied in an application-specific integrated circuit.

2. The circuit arrangement as claimed in claim 1, further comprising:
   a second comparator configured to:
      compare the output signal of the detection unit with a predetermined first threshold value; and
      initiate the switch-off process of the transistor switch based at least in part on the outcome of the comparison.

3. The circuit arrangement as claimed in claim 1, further comprising a temperature detection unit configured to:
   detect an ambient temperature; and
   initiate the switch-off process of the transistor switch based at least in part on a predetermined threshold value being exceeded by the detected ambient temperature.

4. The circuit arrangement as claimed in claim 1, further comprising a charge pump configured to drive the transistor switch.

5. The circuit arrangement as claimed in claim 2, wherein the first comparator is embodied in the application-specific integrated circuit.

6. The circuit arrangement as claimed in claim 1, wherein the comparator and the low-pass filter are embodied in the application-specific integrated circuit.

7. The circuit arrangement as claimed in claim 6, wherein the low-pass filter comprises a time constant unit configured to influence a time constant of the low-pass filter based at least in part on the output signal of the detection unit.

8. The circuit arrangement as claimed in claim 7, wherein the time constant unit comprises:
 a first electrical resistor: and
 a second electrical resistor in series with a zener diode, the second electrical resistor in series with the zener diode arranged in parallel with the first electrical resistor.

9. The circuit arrangement as claimed in claim 3, wherein the temperature detection unit is embodied in the application-specific integrated circuit.

10. The circuit arrangement as claimed in claim 8, further comprising a temperature detection unit configured to:
 detect an ambient temperature; and
 initiate the switch-off process of the transistor switch based at least in part on a predetermined third threshold value being exceeded by the detected ambient temperature,
 wherein the temperature detection unit is embodied in the application-specific integrated circuit.

11. The circuit arrangement as claimed in claim 4, wherein the charge pump is embodied in the application-specific integrated circuit.

12. The circuit arrangement as claimed in claim 10, further comprising a charge pump configured to drive the transistor switch.

13. The circuit arrangement as claimed in claim 12, wherein the charge pump is embodied in the application-specific integrated circuit.

14. A circuit arrangement comprising:
 a transistor switch; and
 a detection unit coupled to the transistor switch configured to generate an output signal representative of a load current of the transistor switch based at least in part on an input signal representative of the load current of the transistor switch comprising:
  a temperature compensation unit configured to compensate for a temperature of the transistor switch; and
  a delay unit configured to delay a detection of the input signal until a predetermined switch-on time period relative to a switch-on process of the transistor switch has elapsed,
 wherein the detection unit is embodied in an application-specific integrated circuit;
 a first comparator configured to:
  compare the output signal of the detection unit with a predetermined first threshold value; and
  initiate the switch-off process of the transistor switch based at least in part on the outcome of the comparison; and
 a low-pass filter configured to filter the output of the detection unit; and
 a second comparator configured to:
  compare the filtered output of the detection unit with a predetermined second threshold value; and
  initiate a switch-off process of the transistor switch based at least in part on the outcome of the comparison.

15. The circuit arrangement as claimed in claim 14, wherein the low-pass filter comprises a time constant unit configured to influence a time constant of the low-pass filter based at least in part on the output signal of the detection unit.

16. The circuit arrangement as claimed in claim 15, wherein the time constant unit comprises:
 a first electrical resistor; and
 a second electrical resistor in series with a zener diode, the second electrical resistor in series with the zener diode arranged in parallel with the first electrical resistor.

17. The circuit arrangement as claimed in claim 14, wherein the second comparator with the low-pass filter is embodied in the application-specific integrated circuit.

* * * * *